(12) United States Patent
Lee et al.

(10) Patent No.: US 12,349,568 B2
(45) Date of Patent: Jul. 1, 2025

(54) DISPLAY DEVICE

(71) Applicant: Samsung Display Co., Ltd., Yongin-si (KR)

(72) Inventors: Donghyun Lee, Asan-si (KR); Sanghyuck Yoon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 637 days.

(21) Appl. No.: 17/750,576

(22) Filed: May 23, 2022

(65) Prior Publication Data

US 2022/0392992 A1 Dec. 8, 2022

(30) Foreign Application Priority Data

Jun. 2, 2021 (KR) .................. 10-2021-0071753

(51) Int. Cl.
*H10K 59/131* (2023.01)

(52) U.S. Cl.
CPC .................. *H10K 59/131* (2023.02)

(58) Field of Classification Search
CPC .......... H10K 59/131; H10K 59/1275
USPC ....................................... 257/211
See application file for complete search history.

(56) References Cited

U.S. PATENT DOCUMENTS

| | | | |
|---|---|---|---|
| 10,303,016 B2 | 5/2019 | Son et al. | |
| 10,310,341 B2 | 6/2019 | Choi et al. | |
| 10,566,554 B2 | 2/2020 | Li et al. | |
| 2017/0357121 A1* | 12/2017 | Cho | G02F 1/1368 |
| 2020/0411630 A1* | 12/2020 | Kim | H01L 24/03 |
| 2021/0066437 A1* | 3/2021 | Ryu | H10K 59/131 |
| 2021/0072582 A1 | 3/2021 | Kim et al. | |
| 2021/0313411 A1* | 10/2021 | Jung | H10K 59/88 |

FOREIGN PATENT DOCUMENTS

| | | |
|---|---|---|
| KR | 1020170002283 A | 1/2017 |
| KR | 1020180028096 A | 3/2018 |
| KR | 1020210029882 A | 3/2021 |

* cited by examiner

*Primary Examiner* — Igwe U Anya
(74) *Attorney, Agent, or Firm* — CANTOR COLBURN LLP

(57) ABSTRACT

A display device includes a side surface which is exposed to outside the display device, a circuit element layer including a gate line layer spaced apart from the side surface of the display device, a data line layer which is exposed to outside the display device at the side surface of the display device, and an insulating layer between the gate line layer and the data line layer, and a pad which faces the side surface of the display device and is connected to the circuit element layer at the data line layer.

20 Claims, 14 Drawing Sheets

DISPLAY DEVICE

This application claims priority to Korean Patent Application No. 10-2021-0071753, filed on Jun. 2, 2021, and all the benefits accruing therefrom under 35 U.S.C. § 119, the entire contents of which are hereby incorporated by reference.

BACKGROUND

(1) Field

The present disclosure herein relates to a display device, and more particularly, to a display device having improved reliability.

(2) Description of the Related Art

A display device may include a display module and a driving chip which is electrically connected to the display module. The driving chip may transmit a signal to the display module or receive a signal transmitted from the display module.

The driving chip may be mounted on the display module by a chip-on-glass (COG) method, a chip-on-film (COF) method, a chip-on-PI (COP) method, or the like. The COG, COF, and COP methods transfer an electrical signal to the display module by directly mounting the driving chip in a non-display region of the display module. For example, the driving chip may be directly mounted on the display module by using an anisotropic conductive film AF.

Research has been conducted on a structure in which a driving chip is disposed on a side surface of a display module in order to widen the display region of a display device on which an image is displayed.

SUMMARY

One or more embodiment provides a display device which may have improved reliability.

An embodiment provides a display device including a base layer including a top surface, a bottom surface, and a side surface connecting the top surface and the bottom surface, a pad on the side surface, and a circuit element layer on the top surface, where the circuit element layer includes a gate line layer, an insulating layer and a data line layer which are sequentially stacked on the top surface and respectively extend toward the side surface, the data line layer comes in contact with the pad, and the gate line layer does not come in contact with the pad.

In an embodiment, the display device may further include a resin which covers at least a portion of the data line layer and comes in contact with the pad.

In an embodiment, the display device may further include a sealing member which is on the data line layer and comes in contact with the pad.

In an embodiment, the display device may further include a display element layer on the data line layer, where the resin may be disposed between the display element layer and the pad in the side-surface direction.

In an embodiment, at least a portion of the resin may overlap the data line layer while not overlapping the gate line layer.

In an embodiment, the display device may further include a capping layer which is between the data line layer and the resin and includes metal.

In an embodiment, the insulating layer may come in contact with the pad.

In an embodiment, the data line layer may come in contact with at least a portion of the top surface.

In an embodiment, at least a portion of the data line layer may come in contact with the gate line layer.

In an embodiment, the pad may come in contact with the side surface.

In an embodiment, the gate line layer may include molybdenum (Mo).

In an embodiment, a display device may include a base layer including a top surface and a side surface which is connected to the top surface, a pad on the side surface, and a first insulating layer, a first conductive layer, a second insulating layer, a second conductive layer and a third conductive layer which are sequential from the top surface and respectively extend toward the side surface, where the base layer may include a first region and a second region which are sequentially positioned away from the side surface, and one end of each of the first conductive layer and the second conductive layer may be in the second region.

In an embodiment, the display device may further include a third insulating layer between the second conductive layer and the third conductive layer.

In an embodiment, within the first region, the first insulating layer may come in contact with the top surface, the second insulating layer may come in contact with the first insulating layer, the third insulating layer may come in contact with the second insulating layer, and the third conductive layer may come in contact with the third insulating layer.

In an embodiment, on the side surface, each of the first insulating layer, the second insulating layer, and the third insulating layer may come in contact with the pad.

In an embodiment, the third insulating layer may include a plurality of contact holes which overlap the second region and are spaced apart from each other, and the third conductive layer may come in contact with the second conductive layer through the plurality of contact holes.

In an embodiment, within the second region, a whole surface of the third conductive layer may come in contact with the second conductive layer.

In an embodiment, the display device may further include a capping layer which is on the third conductive layer and includes metal.

In an embodiment, a display device may include a display panel including a base layer, a circuit element layer and a display element layer which are sequentially stacked, and a plurality of pads on a side surface of the display panel, where the circuit element layer may include a peripheral line on the base layer and connected to the display element layer, the peripheral line may include at least one of a first conductive layer, a second conductive layer and a third conductive layer which are sequentially stacked, and one insulating layer between two adjacent layers among the first to third conductive layers, and the length of the third conductive layer may be greater than the length of each of the first conductive layer and the second conductive layer.

In an embodiment, the third conductive layer may come in contact with the plurality of pads, and one end of each of the first and second conductive layers may be covered by the insulating layer or the third conductive layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
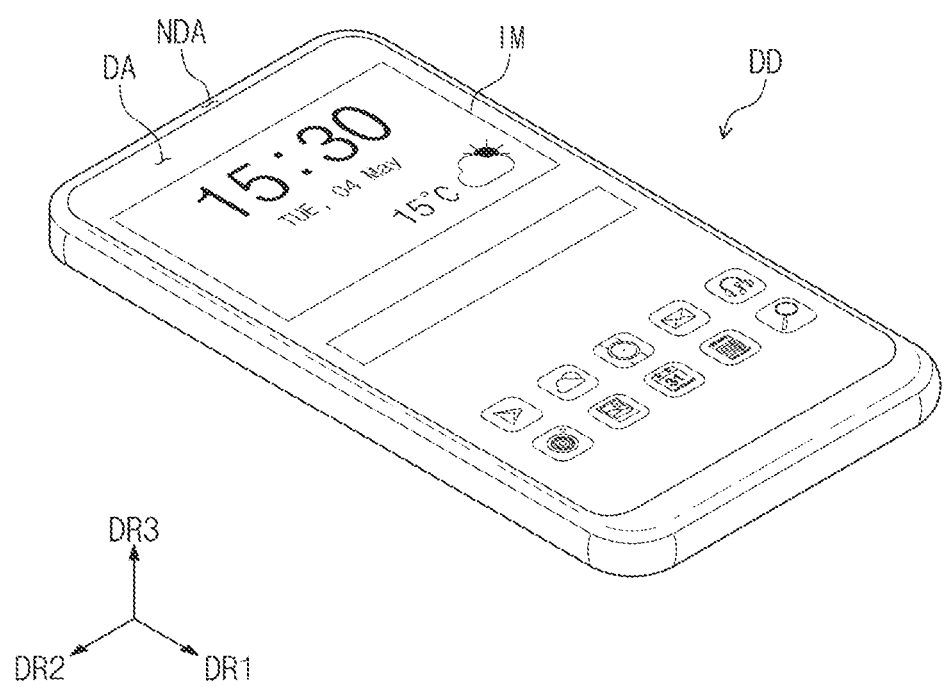
FIG. 1 is a perspective view of an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will be understood that when an element (or region, layer, portion, etc.) is referred to as being related to another element such as being "on", "connected to" or "coupled to" another element, it can be directly on, connected or coupled to the other element, or intervening elements may be present. In contrast, when an element (or region, layer, portion, etc.) is referred to as being related to another element such as being "directly on", "directly connected to" or "directly coupled to" another element, no other element, or intervening elements are present.

Like reference numerals refer to like elements throughout. As used herein, a reference number may indicate a singular element or a plurality of the element. For example, a reference number labeling a singular form of an element within the drawing figures may be used to reference a plurality of the singular element within the text of specification. In addition, in the drawings, the thicknesses, ratios, and dimensions of elements are exaggerated for effective description of the technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations that the associated configurations can define.

It will be understood that, although the terms first, second, etc. may be used herein to describe various elements, these elements should not be limited by these terms. These terms are only used to distinguish one element from another element. For example, a first element could be termed a second element without departing from the scope of the present invention. Similarly, the second element may also be referred to as the first element. The terms of a singular form include plural forms unless otherwise specified.

Terms, such as "below", "lower", "above", "upper" and the like, are used herein for ease of description to describe one element's relation to another element(s) as illustrated in the figures. The above terms are relative concepts and are described based on the directions indicated in the drawings.

It will be understood that the terms "include" and/or "have", when used in this specification, specify the presence of stated features, integers, steps, operations, elements, components and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 2:
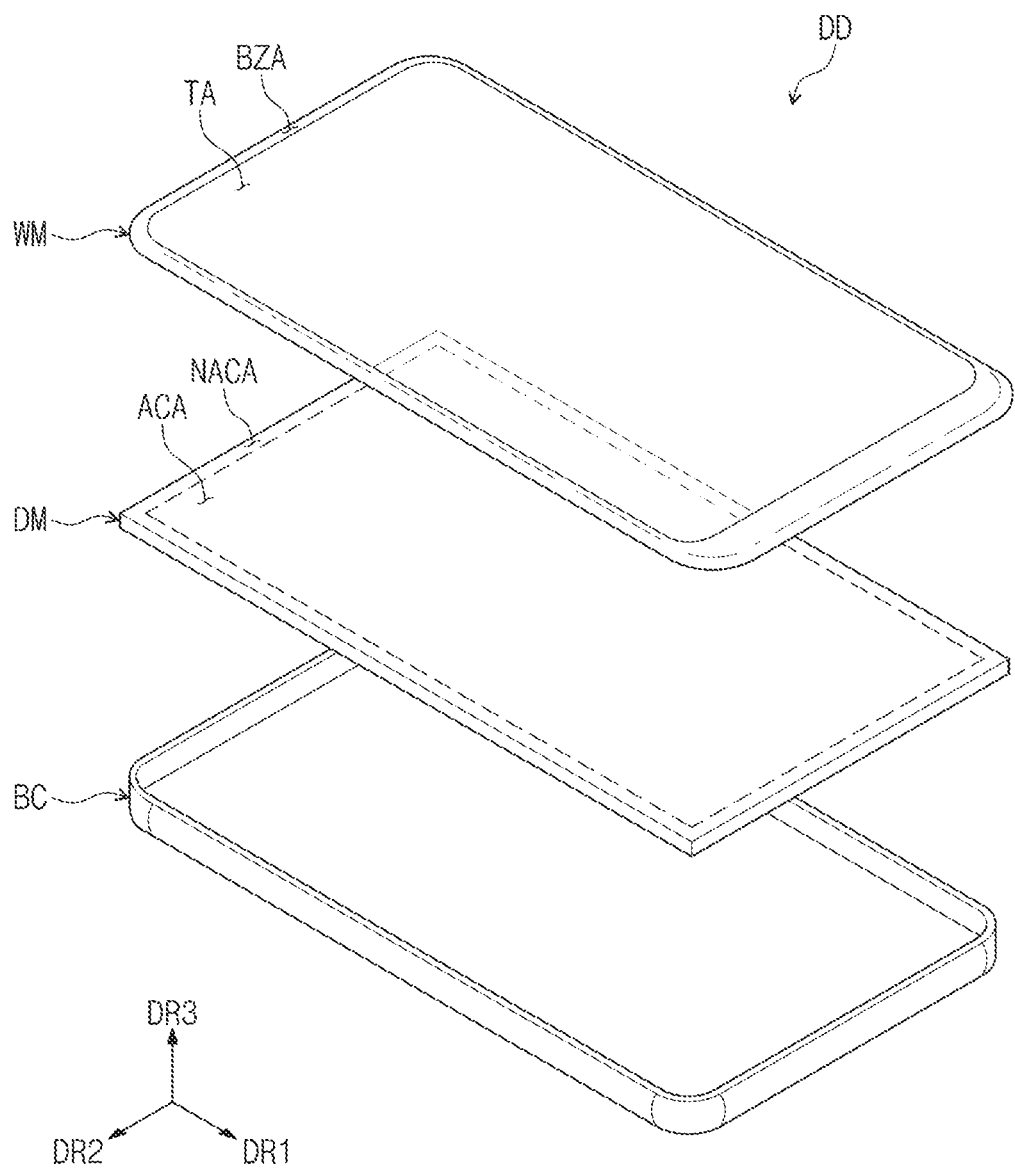
FIG. 2 is an exploded perspective view of an embodiment of the display device.

FIG. 1 is a perspective view of an embodiment of a display device DD. FIG. 2 is an exploded perspective view of an embodiment of the display device DD.

FIG. 1 exemplarily illustrates a display device DD applied to a smartphone. However, without being limited thereto, the display device DD may be not only a large electronic device such as a television or a monitor, but also a small or medium electronic device such as a mobile phone, a tablet, a navigation system, a game machine, or a smart watch.

The display device DD may include a display region DA and a non-display region NDA defined therein. Various components or layers of the display device DD may include a display region DA and a non-display region NDA corresponding to those described herein.

The display region DA may display an image IM or sense an external input (e.g., a touch) to the display device DD. The display region DA may be parallel to a plane which is defined by a first direction DR1 and a second direction DR2 crossing each other. A normal direction of the display region DA, that is, a thickness direction of the display device DD is indicated by a third direction DR3 which crosses each of the first direction DR1 and the second direction DR2. The front surface (or top surface) and the rear surface (or bottom surface) of each member described herein are divided by the third direction DR3. However, the directions indicated by the first to third directions DR1, DR2, and DR3 are relative concepts and may be converted into other directions.

The shape of the display region DA illustrated in FIG. 1 is exemplary, and the shape of the display region DA may be changed without limitation as required.

The non-display region NDA is a region which is adjacent to the display region DA and in which an image IM is not displayed. A bezel region of the display device DD may be defined by the non-display region NDA. The non-display region NDA may surround the display region DA. However, without being limited thereto, the shape of the display region DA and the shape of the non-display region NDA may be changed. Alternatively, in the display device DD, the non-display region NDA may be omitted and only the display region DA may be defined.

Referring to FIGS. 1 and 2 together, the display device DD may include a window WM, a display module DM, and a housing BC. The window WM may face the housing BC with the display module DM therebetween.

The window WM may protect the display module DM from an external impact and may provide a display surface of the display device DD. The window WM may have a transmission region TA and a bezel region BZA defined therein. The transmission region TA may be a region that transmits incident light (e.g., light transmission region). Specifically, an image IM generated by the display module DM may pass through the transmission region TA so as to be visually recognized from outside of the display device DD. The transmission region TA may overlap (or correspond to) the display region DA.

The transmission region TA may have a tetragonal shape parallel to each of the first direction DR1 and the second direction DR2. However, this is illustrated as an example, and the transmission region TA may have various shapes and is not limited to any one embodiment.

The bezel region BZA may be adjacent to the transmission region TA. Specifically, the bezel region BZA may surround the transmission region TA. In an embodiment, the bezel region BZA may have a color. The bezel region BZA may overlap the non-display region NDA.

In an embodiment, the bezel region BZA may be omitted from the window WM, and only the transmission region TA may be defined therein.

The display module DM may be disposed under the window WM. The window WM may protect the display module DM from an external impact and the like.

The display module DM is parallel to a plane defined by the first direction DR1 and the second direction DR2. The normal direction of the display module DM is indicated by the third direction DR3. The third direction DR3 indicates the thickness direction of the display device DD and various components or layers thereof.

The display module DM may have an active region ACA and a non-active region NACA defined therein. In an embodiment, for example, the non-active region NACA may surround the active region ACA. In an embodiment, for example, the non-active region NACA may be adjacent to at least one side of the active region ACA or may be omitted. In addition, the active region ACA may correspond to the transmission region TA defined in the window WM, and the non-active region NACA may correspond to the bezel region BZA.

In the non-active region NACA, lines for providing an electrical signal to the active region ACA or for receiving an electrical signal from the active region ACA may be disposed.

Although not illustrated separately, an anti-reflection unit may be disposed between the display module DM and the window WM. The anti-reflection unit may reduce the reflectance of external light incident from above the window WM and/or outside of the display device DD.

In an embodiment, for example, the anti-reflection unit may include a retarder, a polarizer, a destructive interference structure, or a color filter and a division pattern. The retarder may be a film type or a liquid crystal coating type and include a $\lambda/2$ retarder and/or a $\lambda/4$ retarder.

The polarizer may also be a film type or a liquid crystal coating type. The film type may include a stretched synthetic resin film, and the liquid crystal coating type may include liquid crystals in an arrangement. The retarder and the polarizer may further include a protective film.

The destructive interference structure may include a first reflective layer and a second reflective layer disposed in different layers. First reflected light and second reflected light reflected respectively from the first and second reflective layers may be destructively interfered, thus reducing external light reflectance.

Alternatively, the anti-reflection unit may be omitted. In an embodiment, for example, the display device DD may include a color filter and a division pattern and may not include a separate anti-reflection unit. The color filter may transmit light generated by the display module DM or convert light from one wavelength to another. The division pattern may include a light-blocking material so as to prevent (or effectively reduce) the color mixing of light passing through the color filter. The light-blocking material of the division pattern may absorb external light. In an embodiment, for example, the division pattern may include a blue or black material.

At least a portion of the housing BC may be disposed under the display module DM. The housing BC may accommodate the window WM and the display module DM.

Figure 3A:
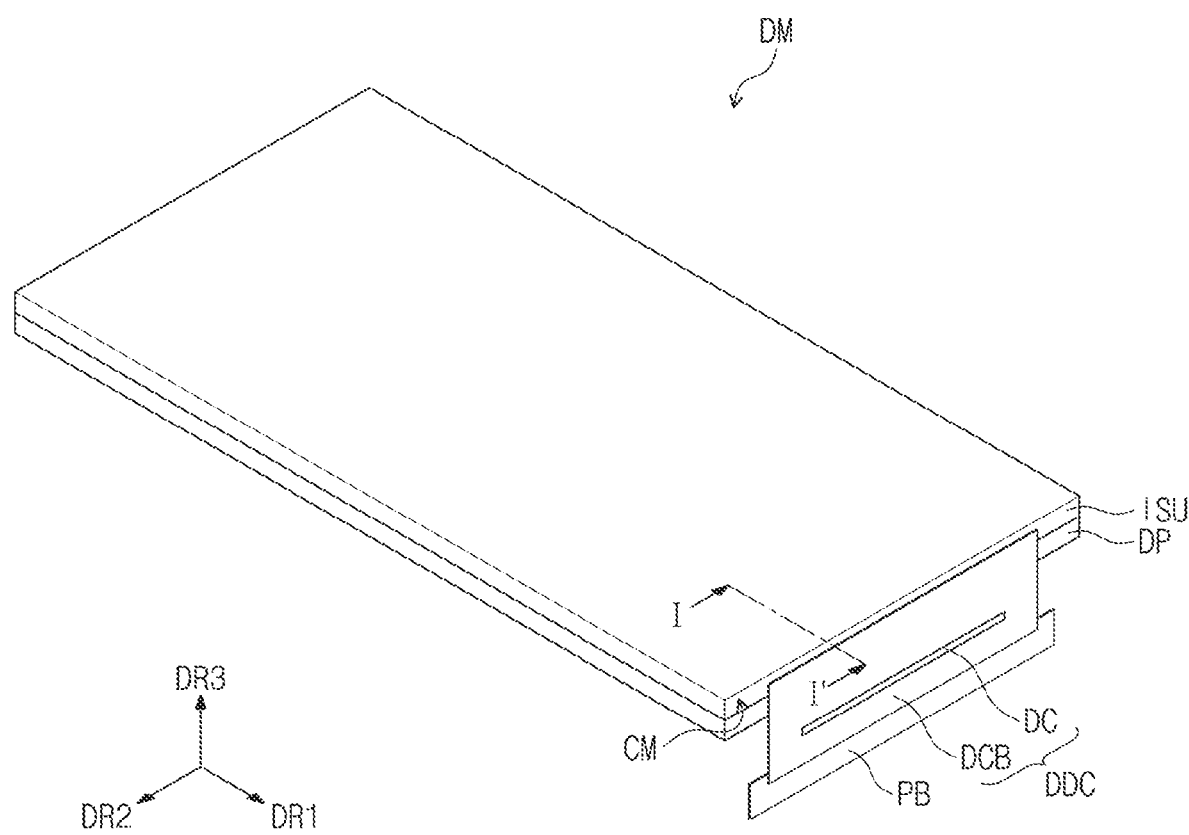
FIG. 3A is a perspective view of an embodiment of a display module.
Figure 3B:
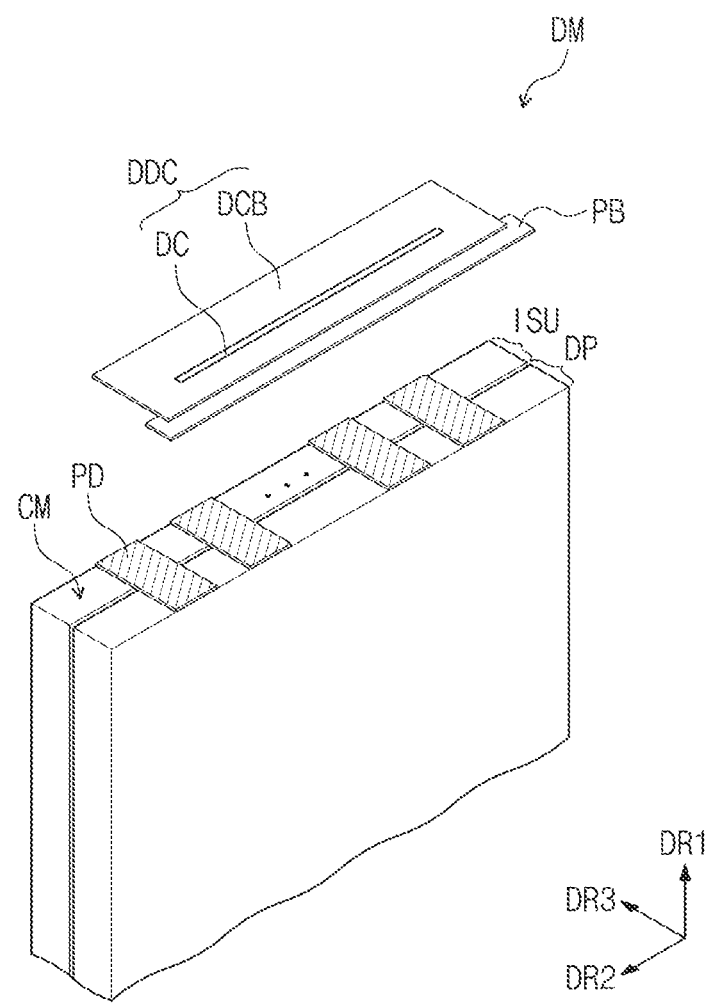
FIG. 3B is an exploded perspective view of an embodiment of the display module.

FIG. 3A is a perspective view of an embodiment of a display module DM. FIG. 3B is an exploded perspective view of an embodiment of the display module DM.

Referring to FIG. 3A, the display module DM may include a display panel DP for generating an image IM and an input detection sensor ISU for sensing an external input. In addition, the display module DM may include a pad PD provided in plural including a plurality of pads PD (see FIG. 3B) and a driving circuit DDC for transmitting an electrical signal to the display panel DP and the input detection sensor ISU. The plurality of pads PD (see FIG. 3B) may include a conductive material.

The driving circuit DDC may be connected to a main circuit board (not shown) through a circuit board PB. Although one driving circuit DDC is illustrated in the drawing, the invention is not limited thereto. That is, the display device DD may include a plurality of driving circuit DDC, and at least any one of the plurality of driving circuits may include input pads for providing a driving signal to the input detection sensor ISU.

In addition, although the driving circuit DDC is illustrated as being disposed on a side surface CM (or end surface) of the display module DM, a plurality of driving circuits DDC may be provided so as to be disposed on at least one side of the display module DM. An end surface of the display panel DP together with an end surface of the input detection sensor ISU may define a portion of the side surface CM of the display module DM.

Figure 5:
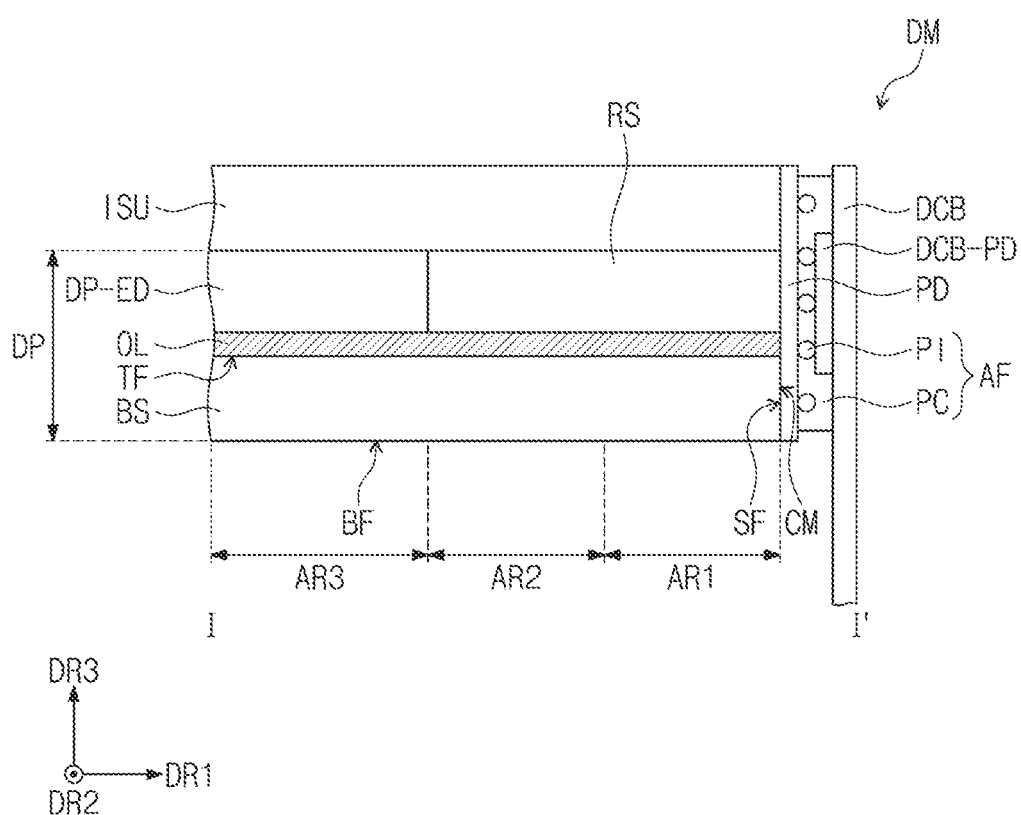
FIG. 5 is a cross-sectional view of an embodiment of the display module taken along line I-I' illustrated in FIG. 3A.

The driving circuit DDC may include a driving circuit board DCB, a driving chip DC disposed on the driving circuit board DCB, and a plurality of driving pads DCB-PD (see FIG. 5). The driving circuit board DCB may be electrically connected to each of the display panel DP and the input detection sensor ISU.

In an embodiment, the driving circuit board DCB may be provided as a flexible printed circuit board. In an embodiment, for example, the driving circuit board DCB may be bent from the side surface CM of the display module DM to the bottom surface of the display module DM. Accordingly, the driving chip DC may be disposed on the driving circuit board DCB overlapping the bottom surface of the display module DM.

The driving chip DC may generate overall driving signals used for driving the display panel DP and the input detection sensor ISU. The driving signals output from the driving chip DC may be transmitted to at least one of the display panel DP or the input detection sensor ISU through the driving circuit board DCB.

The display panel DP may be an organic light-emitting diode display panel, a quantum dot display panel, a liquid crystal display panel, a plasma display panel, an electrophoretic display panel, a microelectromechanical system (MEMS) display panel, an electrowetting display panel, or the like.

The input detection sensor ISU may be disposed between the window WM (see FIG. 2) and the display panel DP. That is, the display panel DP may face the window WM with the input detection sensor ISU therebetween. The input detection sensor ISU detects an input applied from outside the display panel DP and/or the display device DD. An externally applied input may be provided in various forms. In an embodiment, for example, the external input may include a contact or touch, light, heat, pressure, etc. which is applied from an input tool such as a body part, a stylus pen, etc. In addition, not only a touch by contact, but also a spatial touch (e.g., hovering) in a close or proximate distance may be one type of input. In an embodiment, the input detection sensor ISU may be omitted.

Referring to FIG. 3B, a plurality of pads PD for electrical connection with the driving circuit board DCB may be disposed on the side surface CM of the display module DM. In an embodiment, for example, the plurality of pads PD may be formed (or provided) on the side surface CM of the display module DM by a sputtering, evaporation, or inkjet method.

FIG. 3B illustrates that a plurality of pads PD are disposed to overlap both the display panel DP and the input detection sensor ISU. Accordingly, the driving signals output from the driving chip DC may be transmitted to both the display panel DP and the input detection sensor ISU through the driving circuit board DCB. However, the invention is not limited thereto.

One or more embodiment of the display device DD may include the driving circuit DDC disposed on the side surface CM of the display module DM and, therefore, may secure an active region ACA which is wider than a conventional display device in which a conventional driving circuit is disposed on the top surface of a conventional display panel.

Figure 4A:
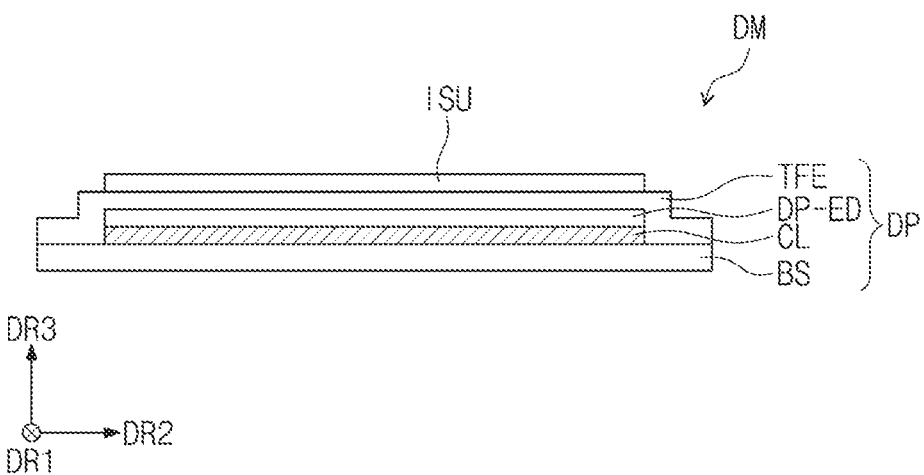
FIGS. 4A and 4B are cross-sectional views of embodiments of display modules.
Figure 4B:
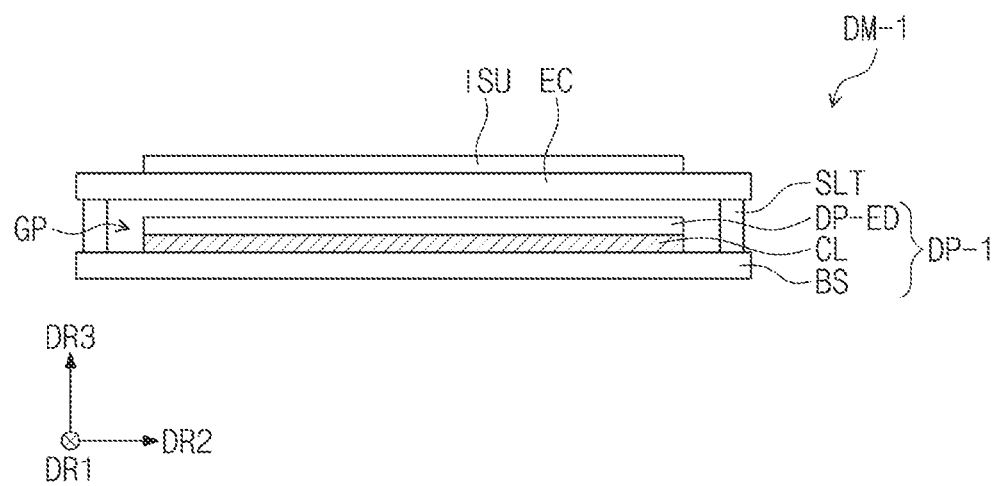

FIGS. 4A and 4B are cross-sectional views of embodiments of display modules DM and DM-1, respectively.

Referring to FIG. 4A, the display module DM may include a display panel DP and an input detection sensor ISU. In an embodiment, the input detection sensor ISU may be in the form of an input sensing layer. That is, the input detection sensor ISU may be disposed directly on the display panel DP. In this specification, the words "Configuration B is disposed directly on configuration A." mean that there is no adhesive layer between the configuration A and the configuration B. As used herein, elements which are related such as being directly on each other or in contact with each other may form an interface therebetween, without being limited thereto.

The display panel DP may include a base layer BS (or a base substrate), a circuit element layer CL disposed on the base layer BS, a display element layer DP-ED, and an encapsulation layer TFE. The base layer BS may include at least one plastic film. The base layer BS may include a plastic substrate, a glass substrate, a metal substrate, or an organic/inorganic composite material substrate. In this embodiment, the base layer BS may be a thin-film glass substrate having a thickness of several tens to several hundreds of micrometers. The base layer BS may have a multi-layered structure. In an embodiment, for example, the base layer BS may include polyimide/at least one inorganic layer/polyimide.

The circuit element layer CL may include at least one insulating layer and one circuit element. The insulating layer may include at least one inorganic layer and at least one organic layer. The circuit element may include signal lines, a pixel driving circuit, and the like. A detailed description of the circuit element layer CL will be described later.

The display element layer DP-ED includes at least one light-emitting element, for example, organic light-emitting diodes. The display element layer DP-ED may further include an organic layer such as a pixel defining layer.

The encapsulation layer TFE may include a plurality of thin films. A portion of the thin films may be disposed to improve optical efficiency, and other thin films may be disposed to protect organic light-emitting diodes. The encapsulation layer TFE may include at least one organic layer and at least one inorganic layer. In an embodiment, for example, the encapsulation layer TFE may include a structure of inorganic layer/organic layer/inorganic layer. The encapsulation layer TFE may encapsulate the display element layer DP-ED. In an embodiment, the encapsulation layer TFE may include an end surface which defines a portion of the side surface CM of the display device DD, without being limited thereto.

The input detection sensor ISU may be disposed directly on the encapsulation layer TFE.

However, the embodiment is not limited thereto. In an embodiment, the input detection sensor ISU may be provided as a separate panel so as to be coupled to the display panel DP by an intervening member such as an adhesive layer.

Referring to FIG. 4B, the display module DM-1 may include a display panel DP-1, an encapsulation substrate EC, a sealant SLT, and an input detection sensor ISU.

The sealant SLT may bond the base layer BS and the encapsulation substrate EC to each other. In an embodiment, the sealant SLT may include an end surface which defines a portion of the side surface CM of the display device DD, without being limited thereto.

The encapsulation substrate EC may be spaced apart from the display element layer DP-ED with a gap GP therebetween. The base layer BS and the encapsulation substrate EC may include a plastic substrate, a glass substrate, a metal substrate, an organic/inorganic composite material substrate, or the like. The sealant SLT may include an organic adhesive, frit, or the like. The gap GP may be filled with a material. The gap GP may be filled with a moisture absorbent or a resin material.

The following description will be given with reference to the display module DM of FIG. 4A. However, the invention is not limited thereto, and the following description may be equally applied to the display module DM-1 of FIG. 4B.

FIG. 5 is a cross-sectional view of an embodiment of the display module DM taken along line I-I' illustrated in FIG. 3A.

Referring to FIG. 5, the display module DM may include a display panel DP, an input detection sensor ISU disposed on the display panel DP, and a driving circuit board DCB disposed on the side surface CM of the display module DM. The display panel DP is illustrated as including a base layer BS, a peripheral line OL, and a display element layer DP-ED while some components are omitted. The peripheral line OL may be a component included in the aforementioned circuit element layer CL, and a detailed description thereof will be described later.

A resin RS is disposed on the peripheral line OL and may be disposed in the same layer as the display element layer DP-ED. As being in a same layer, elements may be coplanar with each other, without being limited thereto. The resin RS may extend along the first direction DR1 so as to be disposed up to the side surface CM of the display module DM, such as to be coplanar with the side surface CM. An end surface of the resin RS and/or the peripheral line OL may define a portion of the side surface CM. The resin RS may flatten the side surface CM of the display module DM. That is, the resin RS may serve to fill a space between the base layer BS and the input detection sensor ISU. Specifically, the resin RS may cover at least a portion of the peripheral line OL and fill a space between the peripheral line OL and the input detection sensor ISU. The thickness of the resin RS may be adjusted according to the thickness of the peripheral line OL in an embodiment, for example, when the thickness of the peripheral line OL increases, the thickness of the resin RS may decrease, and when the thickness of the peripheral line OL decreases, the thickness of the resin RS may increase.

The resin RS may include a transparent material. In an embodiment, for example, the resin RS may include a light curing agent. The resin RS may include an organic material or an inorganic material as a material thereof. In an embodiment, for example, the resin RS may include an epoxy resin, an acrylic resin, a urethane resin, or a compound or combination thereof. In an embodiment, frit (seal) may be used instead of the resin RS for the display device DD. The plurality of pads PD may be supported by the resin RS.

The base layer BS includes a top surface TF, a bottom surface BF facing the top surface TF, and a side surface SF. The side surface SF connects the top surface TF and the bottom surface BF to each other. Although one side surface SF is illustrated in FIG. 5, the side surface SF may be provided in plurality. In an embodiment, for example, four side surfaces SF may be provided. The side surface SF of the base layer BS and the side surface CM of the display module DM may be in the same plane (e.g., coplanar with each other).

The peripheral line OL may be disposed on the top surface TF of the base layer BS and may extend from an inner area of the base layer BS and in the direction of the side surface SF of the base layer BS. The peripheral line OL may be electrically connected to the display element layer DP-ED.

A plurality of pads PD are disposed on the side surface SF of the base layer BS. In an embodiment, the plurality of pads PD may come in contact with the base layer BS, the peripheral line OL, the resin RS, and the input detection sensor ISU. The plurality of pads PD may be bonded to the driving circuit board DCB by an anisotropic conductive film AF. The anisotropic conductive film AF may include conductive particles PI formed inside an adhesive film PC having adhesive properties.

The conductive particles PI may electrically connect the plurality of driving pads DCB-PD of the driving circuit board DCB to the plurality of pads PD. Accordingly, an electrical signal transmitted from the driving circuit board DCB may be provided to the display element layer DP-ED and/or the input detection sensor ISU through the plurality of pads PD. However, the bonding method is not limited thereto, and for example, ultrasonic bonding, metal direct bonding (MDB), and soldering may be instead of the anisotropic conductive film AF.

Figure 6A:
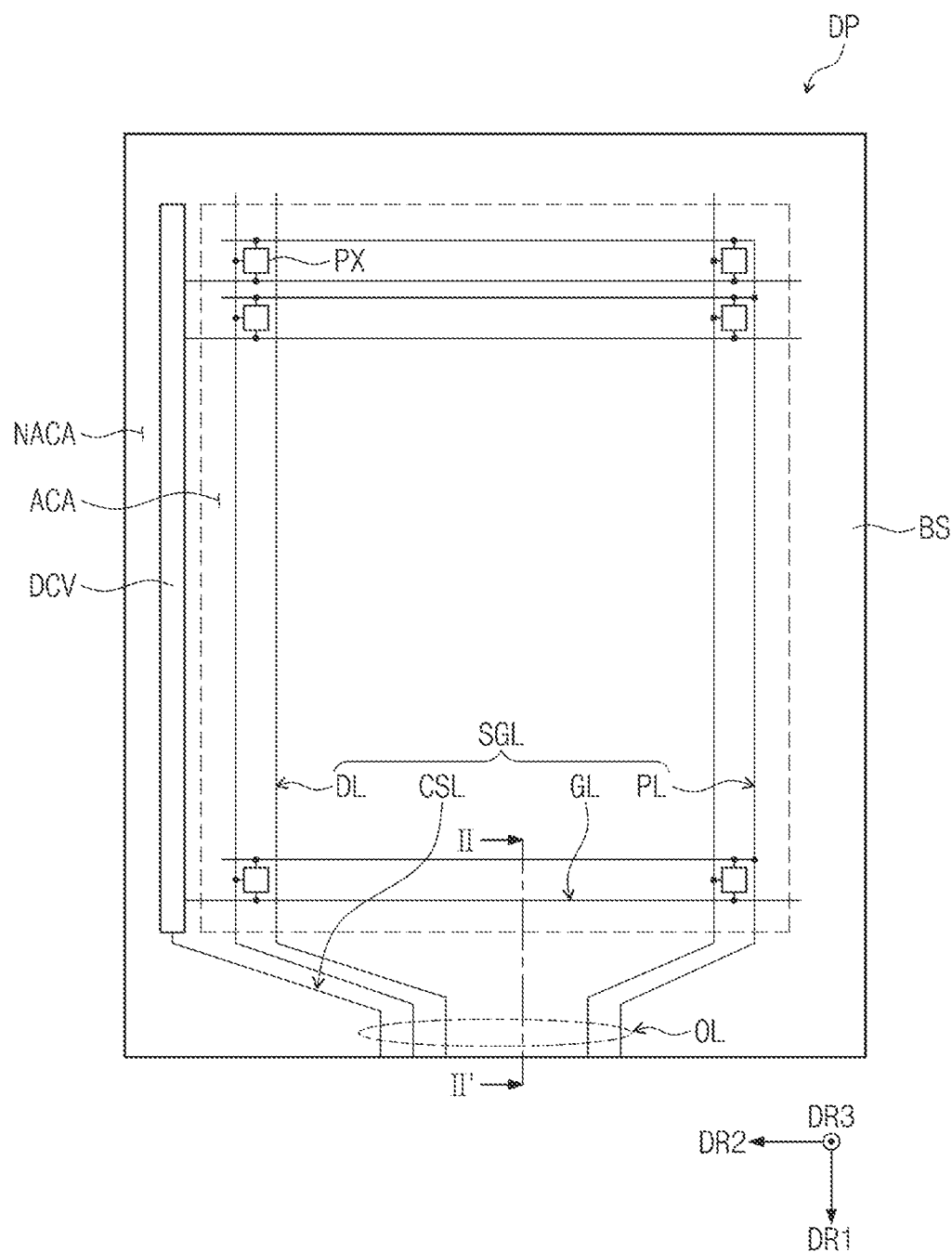
FIG. 6A is a plan view of an embodiment of a display panel.

FIG. 6A is a plan view of an embodiment of a display panel DP. The display panel DP may have an active region ACA and a non-active region NACA defined therein. As described above, the non-active region NACA may be adjacent to at least one side of the active region ACA or may be omitted. A plurality of pixels PX may be disposed in the active region ACA. Each of the pixels PX may include a light-emitting element LD (see FIG. 6B) as a display element. In an embodiment, for example, the light-emitting element LD may be an organic electroluminescent element.

A plurality of signal lines SGL for providing a signal to a pixel PX may be disposed in the active region ACA and in the non-active region NACA.

The plurality of signal lines SGL may include a gate line GL provided in plural including gate lines GL, a data line DL provided in plural including data lines DL, a power line PL, and a control signal line CSL. The gate lines GL are respectively connected to a corresponding pixel PX among the plurality of pixels PX, and the data lines DL are respectively connected to a corresponding pixel PX among the plurality of pixels PX. The power line PL is connected to a plurality of pixels PX. In addition, a gate driving circuit DCV to which the gate lines GL are connected may be disposed in the non-active region NACA. The control signal line CSL may provide control signals to the gate driving circuit DCV.

The plurality of signal lines SGL may be connected to an external circuit board which is outside of the display panel DP and provide an electrical signal to a pixel PX.

A portion of the plurality of signal lines SGL may extend to one end of the display panel DP (e.g., an end portion). In an embodiment, for example, the display panel DP may have a rectangular shape including long sides extending in (or along) the first direction DR1 and short sides extending in (or along) the second direction DR2. A portion of the plurality of signal lines SGL may extend in the first direction DR1 toward the one end of the display panel DP. The plurality of signal lines SGL may be more densely disposed as a distance to the one end of the display panel DP decreases. The densely disposed lines may be connected to the external circuit board at the end of the display panel DP.

A line (or line portion) disposed adjacent to (or closest to) the one end of the display panel DP among the plurality of signal lines SGL is defined as a peripheral line OL. The peripheral line OL may be a line portion of the signal lines SGL which is furthest from the active region ACA. At least a portion of the peripheral line OL may overlap the non-active region NACA. The peripheral line OL may come in contact with the plurality of pads PD (see FIG. 3A) disposed on the side surface CM of the display module DM. The peripheral line OL may be electrically connected to the aforementioned driving circuit board DCB (see FIG. 3A).

Although FIG. 6A illustrates that the peripheral line OL is adjacent to a short side of the display panel DP, the invention is not limited thereto, and the peripheral line OL may be disposed adjacent to a long side of the display panel DP.

The peripheral line OL may include at least one layer. Specifically, the peripheral line OL may include or define at least one of the layers included in the circuit element layer CL, which will be described later.

Figure 6B:
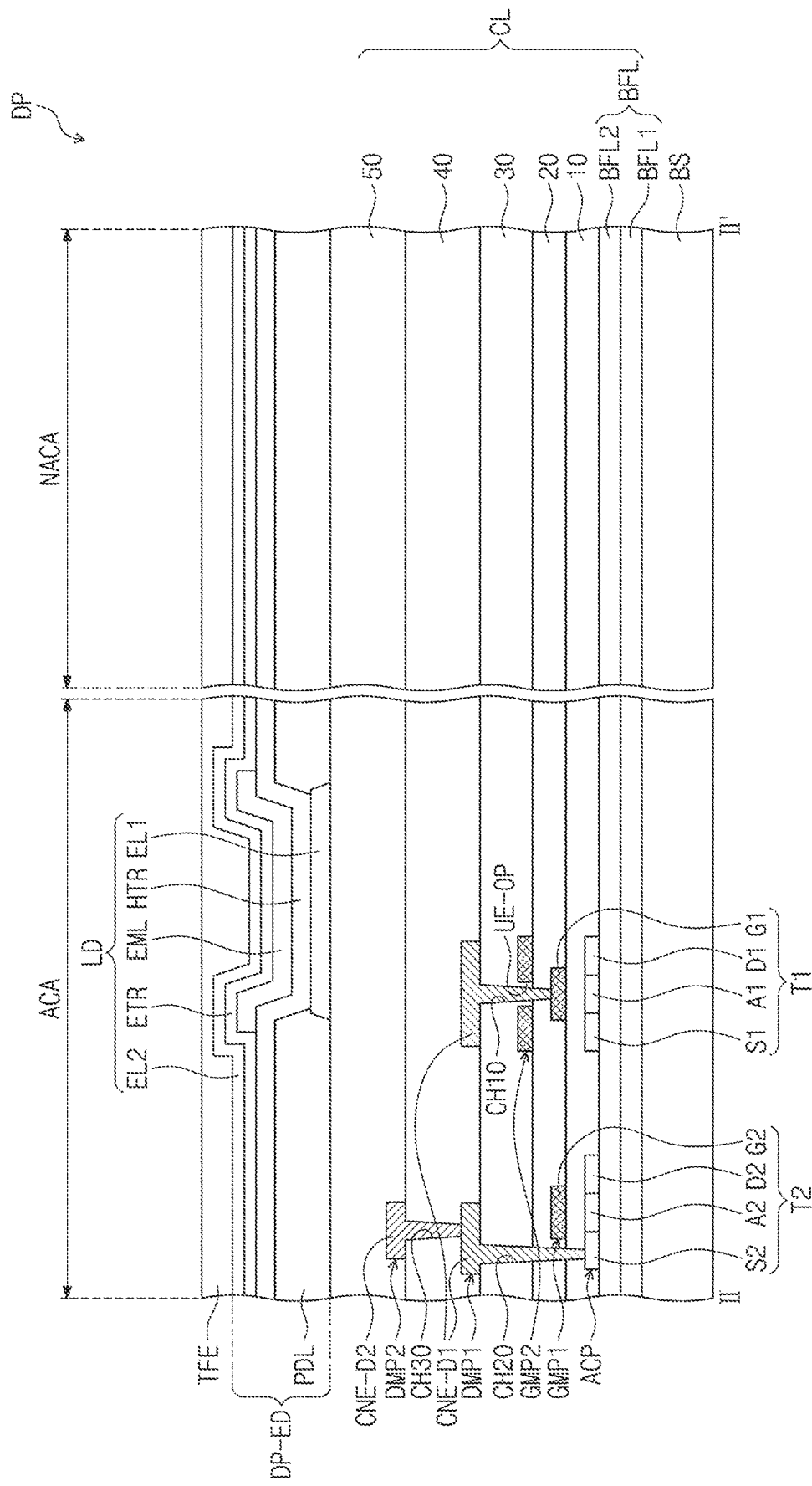
FIG. 6B is a cross-sectional view of an embodiment of the display panel taken along line II-II' illustrated in FIG. 6A.

FIG. 6B is a cross-sectional view of an embodiment of the display panel DP taken along line II-II' illustrated in FIG. 6A.

Referring to FIG. 6B, the display panel DP may include a base layer BS, a circuit element layer CL, and a display element layer DP-ED, which are sequentially stacked.

The base layer BS may include a glass substrate and/or a synthetic resin film. In an embodiment, for example, the base layer BS may include a flexible material. Depending on the material of the base layer BS, the display device DD may be a flexible display device or a rigid display device.

The circuit element layer CL may include a first buffer layer BFL1, a second buffer layer BFL2, a first insulating layer 10, a second insulating layer 20, a third insulating layer 30, a fourth insulating layer 40, a fifth insulating layer 50, a plurality of semiconductor patterns ACP, a first conductive layer GMP1 including a plurality of patterns, a second conductive layer GMP2 including a plurality of patterns, a third conductive layer DMP1 including a plurality of patterns, and a fourth conductive layer DMP2 including a plurality of patterns.

The first and second buffer layers BFL1 and BFL2 may be inorganic films. In an embodiment, the first and second buffer layers BFL1 and BFL2 may be selectively disposed or omitted.

The first to third insulating layers 10, 20, and 30 may be provided as inorganic films or organic films, or a combination thereof. In an embodiment, for example, the first to third insulating layers 10, 20, and 30 may include a silicon nitride layer and a silicon oxide layer. The materials of the inorganic film and the organic film are not particularly limited.

The fourth insulating layer 40 and the fifth insulating layer 50 may be provided as inorganic films or organic films, or a combination thereof. In an embodiment, for example, the fourth insulating layer 40 and the fifth insulating layer 50 may include an organic material.

The first to fourth conductive layers GMP1, GMP2, DMP1, and DMP2 may include at least one of molybdenum, titanium, aluminum, or an alloy thereof. In addition, the first to fourth conductive layers GMP1, GMP2, DMP1, and DMP2 may include one layer or a plurality of layers. In an embodiment, for example, the first and second conductive layers GMP1 and GMP2 may include molybdenum. The third and fourth conductive layers DMP1 and DMP2 may not include molybdenum. In an embodiment, for example, the third and fourth conductive layers DMP1 and DMP2 may include at least one of titanium, aluminum, or an alloy thereof. However, the invention is not limited thereto.

In this specification, a gate line layer may be one or more of the first and second conductive layers GMP1 and GMP2, and a data line layer may be one or more of the third and fourth conductive layers DMP1 and DMP2. The data line layer may include a side surface CM which defines a portion of the side surface CM of the display device DD. In an embodiment, the encapsulation layer TFE, the sealant SLT and/or the resin layer (e.g., resin RS) as a sealing member may include a side surface CM which defines a portion of the side surface CM of the display device DD, without being limited thereto. The pad PD may be in contact with respective side surfaces of the data line layer and the sealing member. That is, the display device DD may include the pad PD which faces the side surface CM of the display device DD and is connected to the circuit element layer CL at the data line layer.

The first buffer layer BFL1 may be disposed on the base layer BS. The second buffer layer BFL2 may be disposed on the first buffer layer BFL1. The first buffer layer BFL1 and the second buffer layer BFL2 may together define a buffer layer BFL. Each of the first buffer layer BFL1 and the second buffer layer BFL2 may prevent impurities present in the base layer BS from entering into the circuit element layer CL. In particular, diffusion of impurities into the semiconductor patterns ACP of transistors T1 and T2 may be reduced or effectively prevented by the buffer layer BFL.

The semiconductor pattern ACP is disposed on the second buffer layer BFL2. The semiconductor pattern ACP may respectively constitute (or define) a portion of each of the plurality of transistors T1 and T2. The semiconductor pattern ACP may include polysilicon, amorphous silicon, or a metal oxide semiconductor. As an example of the semiconductor pattern ACP, a semiconductor pattern constituting the source S1, active area A1, and drain D1 of the first transistor T1 and a semiconductor pattern ACP constituting the source S2, active area A2 and drain D2 of the second transistor T2 are illustrated. In an embodiment, portions of the first transistor T1 and the second transistor T2 may be modified into a bottom gate structure.

In an embodiment, the first insulating layer 10 may be disposed on the second buffer layer BFL2 and cover the semiconductor pattern ACP. The source S1, active area A1, and drain D1 of the first transistor T1 and the source S2, active area A2, and drain D2 of the second transistor T2 may be disposed under the first insulating layer 10. The first conductive layer GMP1 may be disposed on the first insulating layer 10. The gate G1 of the first transistor T1 and the gate G2 of the second transistor T2 are illustrated as respective patterns of the first conductive layer GMP1.

The second insulating layer 20 may be disposed on the first insulating layer 10 and cover the first conductive layer GMP1.

The second conductive layer GMP2 may be disposed on the second insulating layer 20. In an embodiment, the second conductive layer GMP2 may be a first capacitor electrode of the two electrodes constituting the capacitor of a pixel PX. An upper electrode is illustrated as a respective pattern of the second conductive layer GMP2. The upper electrode may have an opening UE-OP defined therein.

The third insulating layer 30 may be disposed on the second insulating layer 20 and cover the second conductive layer GMP2. The third conductive layer DMP1 may be disposed on the third insulating layer 30. Two first connection electrodes CNE-D1 are exemplarily illustrated as respective patterns of the third conductive layer DMP1.

A first connection electrode CNE-D1 is connected to the gate G1 of the first transistor T1 at (or through) a contact hole CH10 passing through the second insulating layer 20 and the third insulating layer 30. The contact hole CH10 passes through the opening UE-OP of the upper electrode.

A first connection electrode CNE-D1 is connected to the source S2 of the second transistor T2 through a contact hole CH20 passing through the first insulating layer 10, the second insulating layer 20, and the third insulating layer 30.

The fourth insulating layer 40 may be disposed on the third insulating layer 30 and cover the third conductive layer DMP1. The fourth conductive layer DMP2 may be disposed on the fourth insulating layer 40. One second connection electrode CNE-D2 is exemplarily illustrated as a respective pattern of the fourth conductive layer DMP2. The second connection electrode CNE-D2 may be connected to the first corresponding connection electrode CNE-D1 through a contact hole CH30 passing through the fourth insulating layer 40.

The fifth insulating layer 50 may be disposed on the fourth insulating layer 40 and cover the fourth conductive layer DMP2.

The display element layer DP-ED is disposed on the fifth insulating layer 50. The display element layer DP-ED may include a pixel defining film PDL and a light-emitting element LD. The pixel defining film PDL may include an organic material. The pixel defining film PDL may be disposed on the fifth insulating layer 50 and may expose at least a portion of a first electrode EL1 of the light-emitting element LD to outside the pixel defining film PDL.

The light-emitting element LD may be an organic light-emitting element, a micro light-emitting diode (LED), or a light-emitting element using quantum dots.

The light-emitting element LD may include a first electrode EL1, a hole transport region HTR, a light-emitting layer EML, an electron transport region ETR, and a second electrode EL2, in order in a direction away from the base layer BS. In an embodiment, for example, the first electrode EL1 and the second electrode EL2 may include Ag, Mg, Cu, Al, Pt, Pd, Au, Ni, Nd, Ir, Cr, Li, Ca, LiF/Ca, LiF/Al, Mo, Ti, combinations thereof (e.g., Ag and Mg), indium tin oxide (ITO), indium zinc oxide (IZO), zinc oxide (ZnO), indium tin zinc oxide (ITZO) and the like.

The first electrode EL1 may be disposed on the fifth insulating layer 50. Although not illustrated, the first electrode EL1 may be connected to a specific transistor through a corresponding contact hole.

When the light-emitting element LD is an organic light-emitting diode (OLED), at least one of the hole transport region HTR, the light-emitting layer EML, or the electron transport region ETR may include an organic material. In an embodiment, when the light-emitting element LD is a micro LED, the light-emitting layer EML may include an inorganic material.

The peripheral line OL may include at least one of the aforementioned circuit element layers CL. In an embodiment, for example, the peripheral line OL may include at least one of the first to third insulating layers 10, 20, and 30, or the first to fourth conductive layers GMP1, GMP2, DMP1, and DMP2.

Figure 7A:
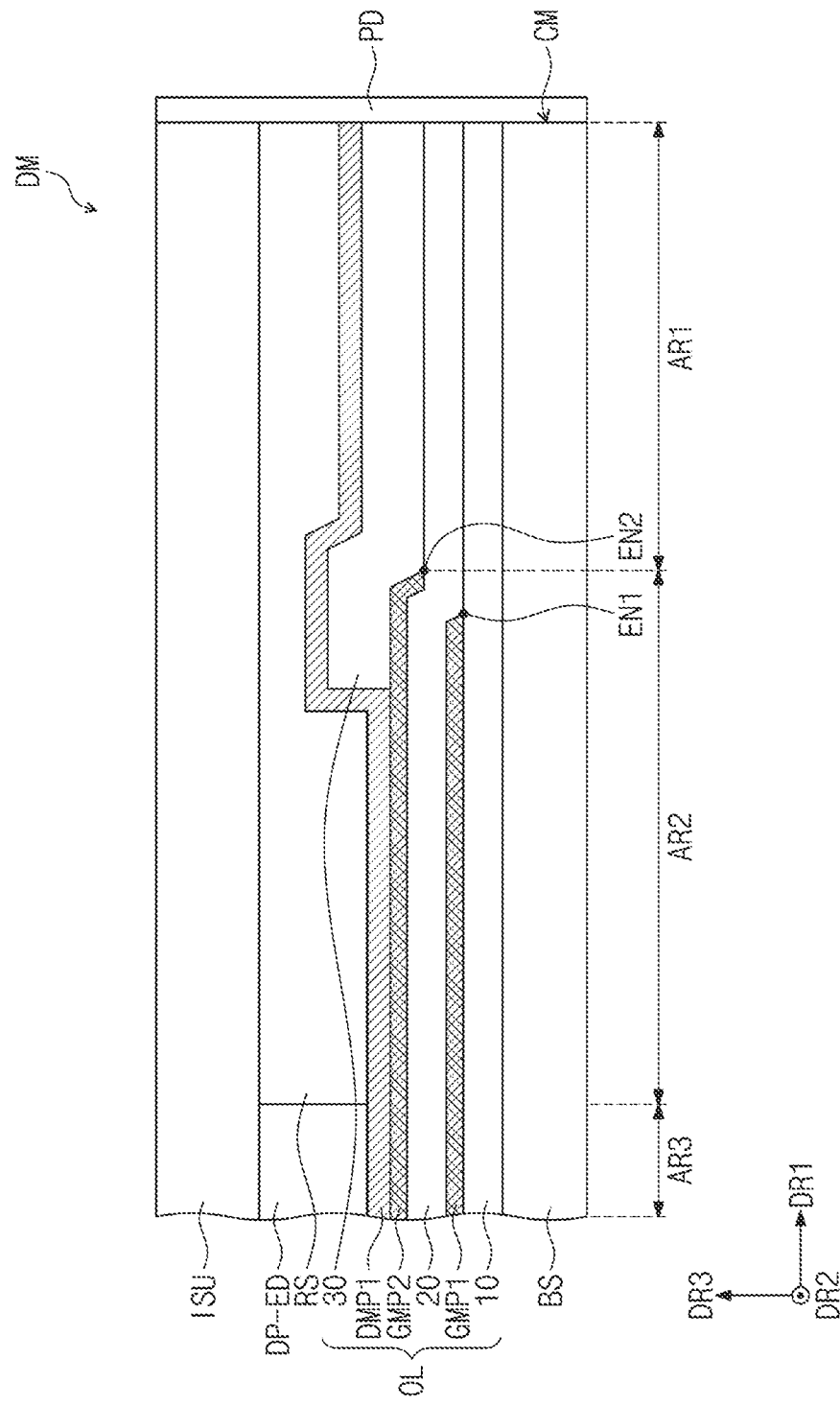
FIG. 7A is a cross-sectional view of an embodiment of a display module.

FIG. 7A is a cross-sectional view of an embodiment of a display module DM.

FIG. 7A is an enlarged view of an end portion of the configuration illustrated in FIG. 5. Hereinafter, as an example, the display module DM in which the buffer layer BFL described above in FIG. 6B is omitted will be described. In an embodiment, in the case of the display module DM including the buffer layer BFL, it may be understood that the top surface TF of the base layer BS described below is applied as the top buffer layer surface of the buffer layer BFL.

Referring to FIG. 7A, one or more embodiment of the peripheral line OL may be disposed on the top surface TF of the base layer BS. In an embodiment, the peripheral line OL may include the first insulating layer 10, the first conductive layer GMP1 disposed on the first insulating layer 10, the second insulating layer 20 covering the first conductive layer GMP1, the second conductive layer GMP2 disposed on the second insulating layer 20, the third insulating layer 30 covering the second conductive layer GMP2, and the third conductive layer DMP1 disposed on the third insulating layer 30, together with each other. In an embodiment, the peripheral line OL includes each of the first conductive layer GMP1, the second conductive layer GMP2 and the third conductive layer DMP1 having a length extended from the display element layer DP-ED and toward the side surface CM of the display panel DP, and the length of the third conductive layer DMP1 greater than the length of each of the first conductive layer GMP1 and the second conductive layer GMP2.

An end portion of the base layer BS which is closest to the side surface CM may be divided into a first region AR1, a second region AR2, and a third region AR3. The third region AR3, the second region AR2, and the first region AR1 may be sequentially defined in order in a direction along the base layer BS from an inner area of the display module DM to the side surface CM of the display module DM.

The peripheral line OL may extend in a direction from the third region AR3 toward the first region AR1. The peripheral line OL may overlap the display element layer DP-ED in the third region AR3. The peripheral line OL may overlap the resin RS in the first region AR1 and the second region AR2.

In an embodiment, for example, the first to third insulating layers 10, 20, and 30 and the third conductive layer DMP1 may extend in a direction from the third region AR3 to the first region AR1 so as to come in contact with a pad PD.

Each of the first conductive layer GMP1 and the second conductive layer GMP2 extends from the third region AR3 only to the second region AR2 and does not come in contact with the pad PD. That is, the first conductive layer GMP1 and the second conductive layer GMP2 may be spaced apart from the pad PD.

A first end EN1 of the first conductive layer GMP1 which is closest to the side surface CM overlaps the second region AR2. The first end EN1 is covered by the second insulating layer 20, and the first conductive layer GMP1 is not disposed in the first region AR1.

A second end EN2 of the second conductive layer GMP2 which is closest to the side surface CM overlaps the second region AR2. The second end EN2 is covered by the third insulating layer 30, and the second conductive layer GMP2 is not disposed in the first region AR1.

That is, the first region AR1 may be a region in which the first and second conductive layers GMP1 and GMP2 are not disposed. The length of the first region AR1 in the first direction DR1 may be changed according to a design of the display device DD. The length of the first region AR1 in the first direction DR1 may be adjusted in a photoresist patterning process of the first and second conductive layers GMP1 and GMP2.

In the first region AR1, the second insulating layer 20 may come in contact with at least a portion of the first insulating layer 10. The first end EN1 of the first conductive layer GMP1 disposed in the second region AR2 may be covered by the second insulating layer 20, and the second insulating layer 20 may come in contact with the first insulating layer 10 in the first region AR1. Accordingly, the first end EN1 of the first conductive layer GMP1 is not exposed to outside the display module DM at the side surface CM of the display module DM.

In the first region AR1, the third insulating layer 30 may come in contact with at least a portion of the second insulating layer 20. The second end EN2 of the second conductive layer GMP2 disposed in the second region AR2 may be covered by the third insulating layer 30, and the third insulating layer 30 may come in contact with the second insulating layer 20 in the first region AR1. Accordingly, the second end EN2 of the second conductive layer GMP2 is not exposed to outside the display module DM at the side surface CM of the display module DM.

In the second region AR2, the third insulating layer 30 may expose a portion of the second conductive layer GMP2 to outside the third insulating layer 30. In the second region AR2, the third conductive layer DMP1 may come in contact with at least a portion of the second conductive layer GMP2, and the third conductive layer DMP1 and the second conductive layer GMP2 may be electrically connected to each other at the second region AR2.

As both the first end EN1 of the first conductive layer GMP1 and the second end EN2 of the second conductive layer GMP2 are disposed inside the display module DM (e.g., spaced apart from the side surface CM), the first and second conductive layers GMP1 and GMP2 may not be exposed to external oxygen and/or moisture to reduce or effectively prevent oxidation of the respective conductive layers. In an embodiment, for example, although the first and second conductive layers GMP1 and GMP2 include molybdenum, formation of molybdenum oxide (MoOx) due to oxidation of the first and second conductive layers GMP1 and GMP2 may be prevented.

Molybdenum oxide (MoOx), as a water-soluble material having a high (electrical) resistance value, may dissolve in water to spread corrosion inside the display panel DP and increase the (electrical) contact resistance between the display panel DP and the driving chip DC, thus causing a problem in operation.

In one or more embodiment, by disposing both the first end EN1 of the first conductive layer GMP1 and the second end EN2 of the second conductive layer GMP2, which may include molybdenum, inside the display module DM, oxidation of the first and second conductive layers GMP1 and GMP2 may be reduced or effectively prevented and the reliability of the display device DD may be improved.

In one or more embodiment, the third conductive layer DMP1 extends to the side surface CM of the display module DM so as to be exposed to outside the display module DM and to come in contact with the pad PD. Accordingly, the third conductive layer DMP1 may be oxidized due to external oxygen and/or moisture based on the material thereof. In an embodiment, the third conductive layer DMP1 may not include molybdenum and may include at least one of titanium, aluminum, or an alloy thereof. When the third conductive layer DMP1 is oxidized, aluminum oxide AlO3 may be formed.

Aluminum oxide (AlO3) has stronger corrosion resistance to water than molybdenum oxide (MoOx), and the oxidation progress rate thereof is slow. Accordingly, when the third conductive layer DMP1 is oxidized, aluminum oxide (AlO3) may be formed with a thin thickness. In an embodiment, for example, aluminum oxide (AlO3) having a thickness of about 40 angstroms (Å) may be formed. In this case, since the third conductive layer DMP1 includes at least one of titanium, aluminum, or an alloy thereof, the contact resistances of the display panel DP and the driving chip DC may not be significantly affected so that the driving reliability of the display module DM may be excellently maintained.

Figure 7B:
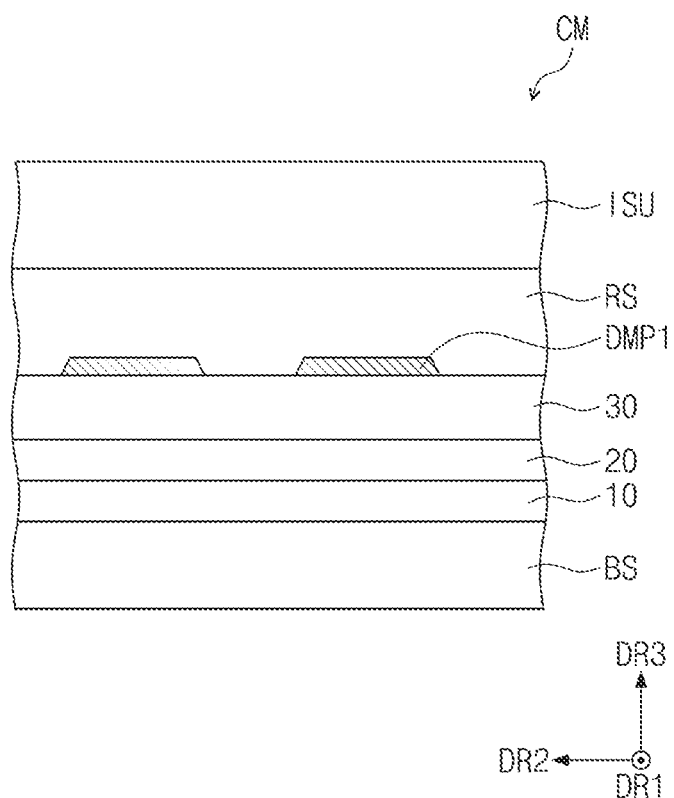
FIG. 7B is a plan view of an embodiment of a side surface of the display module.

FIG. 7B is a plan view of an embodiment of the side surface CM of the display module DM. FIG. 7B is a plan view of the side surface CM viewed along the first direction DR1 with the pad PD omitted from the side surface CM of the display module DM for convenience of illustration.

Referring to FIGS. 7A and 7B together, on the side surface CM, the base layer BS, the first to third insulating layers 10, 20, and 30, the third conductive layer DMP1, the resin RS, and the input detection sensor ISU are exposed to outside the display module DM. As described above, the first and second ends EN1 and EN2 of the first and second conductive layers GMP1 and GMP2 are covered by the second and third insulating layers 20 and 30 and are not exposed to outside of the display module DM. That is, in an embodiment, the first conductive layer GMP1 and the second conductive layer GMP2 are spaced apart from the side surface CM of the display panel DP, and the insulating layer (e.g., the second and third insulating layers 20 and 30) or the third conductive layer DMP1 extends further from the display element layer DP-ED and toward the side surface CM of the display panel DP than each of the first conductive layer GMP1 and the second conductive layer GMP2.

Accordingly, oxidation of the first and second conductive layers GMP1 and GMP2 may be prevented. When compared to existing display devices in which the first and second conductive layers GMP1 and GMP2 are exposed to outside the display module DM, the reliability of the display device DD may be improved when the first and second conductive layers GMP1 and GMP2 are covered by the second and third insulating layers 20 and 30 and are not exposed to outside of the display module DM.

The structure of the peripheral line OL is not limited thereto.

Figure 8:
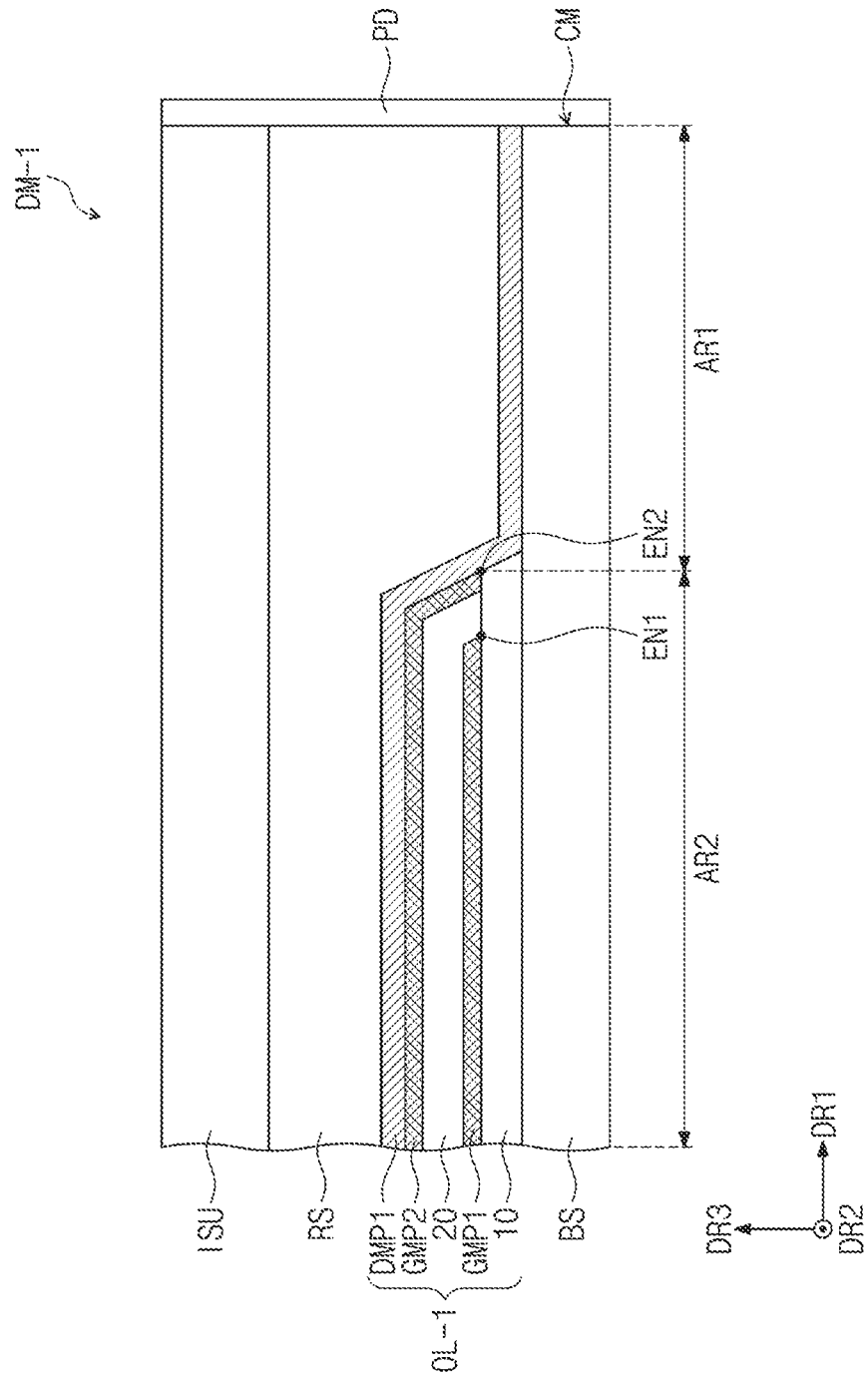
FIGS. 8, 9A, 9B, and 10 are cross-sectional views of embodiments of display modules.

FIG. 8 is a cross-sectional view of an embodiment of a display module DM-1. Hereinafter, the above descriptions will be equally applied to the same configurations as the configurations illustrated in FIGS. 1 to 7B, and detailed descriptions thereof will be omitted. In addition, in the following drawings, the third region AR3 is omitted for convenience of illustration, and descriptions will be given focusing on the first region AR1 and the second region AR2.

Referring to FIG. 8, a peripheral line OL-1 may include a first insulating layer 10, a first conductive layer GMP1 disposed on the first insulating layer 10, a second insulating layer 20 covering the first conductive layer GMP1, a second conductive layer GMP2 disposed on the second insulating layer 20, and a third conductive layer DMP1 disposed on the second conductive layer GMP2.

The peripheral line OL-1 may not include the third insulating layer 30. That is, the peripheral line OL-1 may include a stack of layers between the base layer BS and the resin layer (e.g., resin RS) inclusive, without being limited thereto. Accordingly, the first end EN1 of the first conductive layer GMP1 may be covered by the second insulating layer 20, and the second end EN2 of the second conductive layer GMP2 may be covered by the third conductive layer DMP1.

In addition, in an embodiment, the first insulating layer 10 and the second insulating layer 20 may be offset from each other and from the side surface CM at a location inside the display module DM-1 and may not come in contact with the pad PD. In an embodiment, for example, an end surface of the first insulating layer 10 may be offset from the side surface CM by the third conductive layer DMP1, and an end surface of the second insulating layer 20 may be offset from the side surface CM by the second conductive layer GMP2.

The third conductive layer DMP1 may come in contact with the top surface of the base layer BS in the first region AR1 and may come in contact with the top surface of the second conductive layer GMP2 in the second region AR2. Specifically, in the second region, a whole surface of the third conductive layer may contact the second conductive layer.

Since one or more embodiment of the display module DM-1 includes the stacked structure of the peripheral line OL-1, the occurrence of faults due to a crack or a defect in the first and second insulating layers 10 and 20 may be minimized.

Figure 9A:
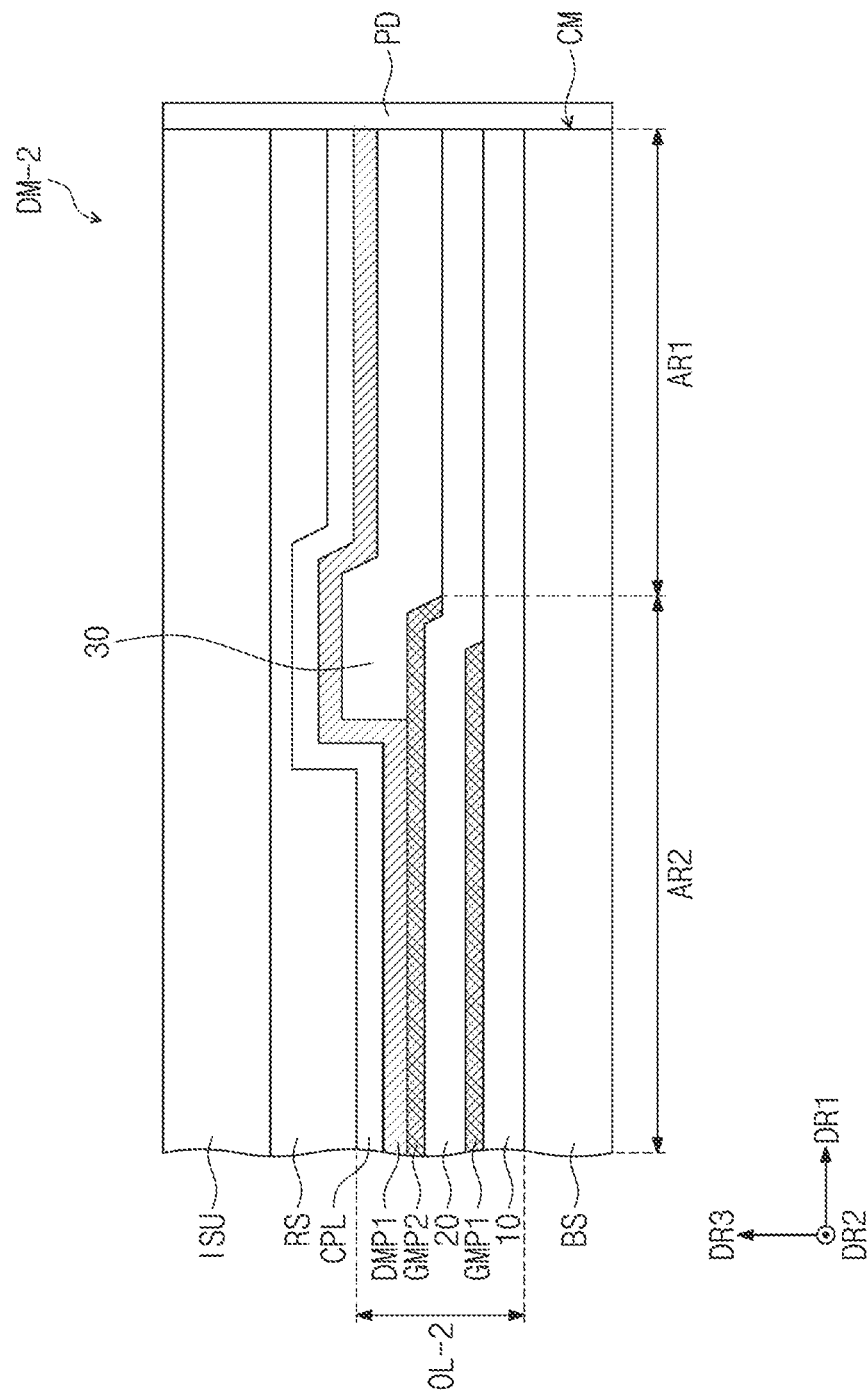
Figure 9B:
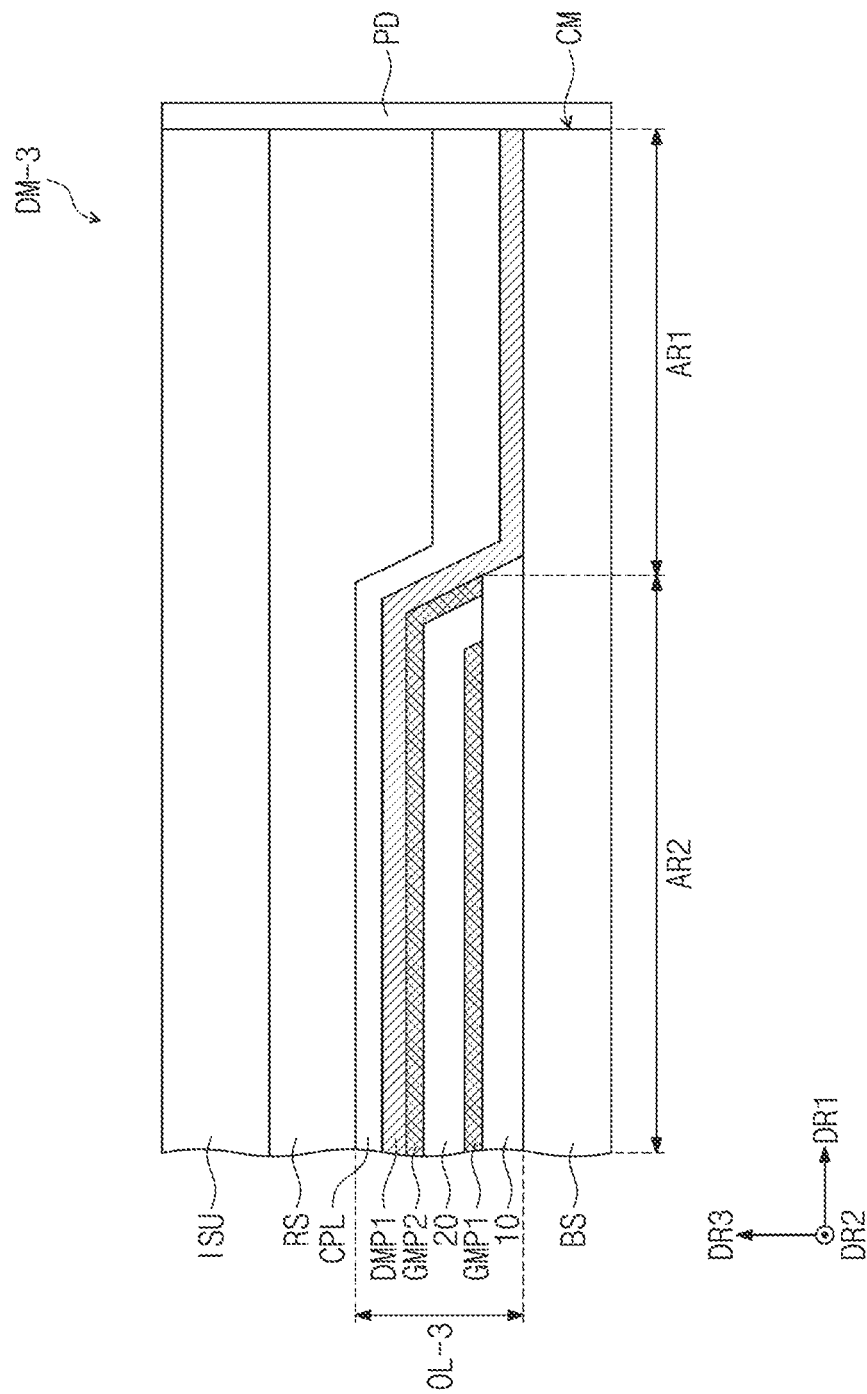

FIGS. 9A and 9B are cross-sectional views of embodiments of display modules DM-2 and DM-3.

Referring to FIGS. 7A and 9A together, a peripheral line OL-2 may further include a capping layer CPL which is conductive (e.g., conductive capping layer). The capping layer CPL may be disposed on the third conductive layer DMP1 and may come in contact therewith.

Referring to FIGS. 8 and 9B together, a peripheral line OL-3 may further include a capping layer CPL including. The capping layer CPL may be disposed on the third conductive layer DMP1 and may come in contact therewith.

In an embodiment, for example, the capping layer CPL may include Ag, Mg, Cu, Al, Pt, Pd, Au, Ni, Nd, Ir, Cr, Li, Ca, LiF/Ca, LiF/Al, Mo, Ti, combinations thereof (e.g., Ag and Mg), indium tin oxide (ITO), indium zinc oxide (IZO), zinc oxide (ZnO), indium tin zinc oxide (ITZO) and the like. As an example, the capping layer CPL may have a structure of Ag/ITO/Ag.

One or more embodiment of the peripheral lines OL-2 and OL-3 may include the capping layer CPL to protect the third conductive layer DMP1 In addition, by increasing a contact area between the pad PD and the peripheral lines OL-2 and OL-3 by including an end surface of the capping layer CPL exposed to outside the display module DM-3, contact resistance may be lowered and driving reliability may be improved.

Figure 10:
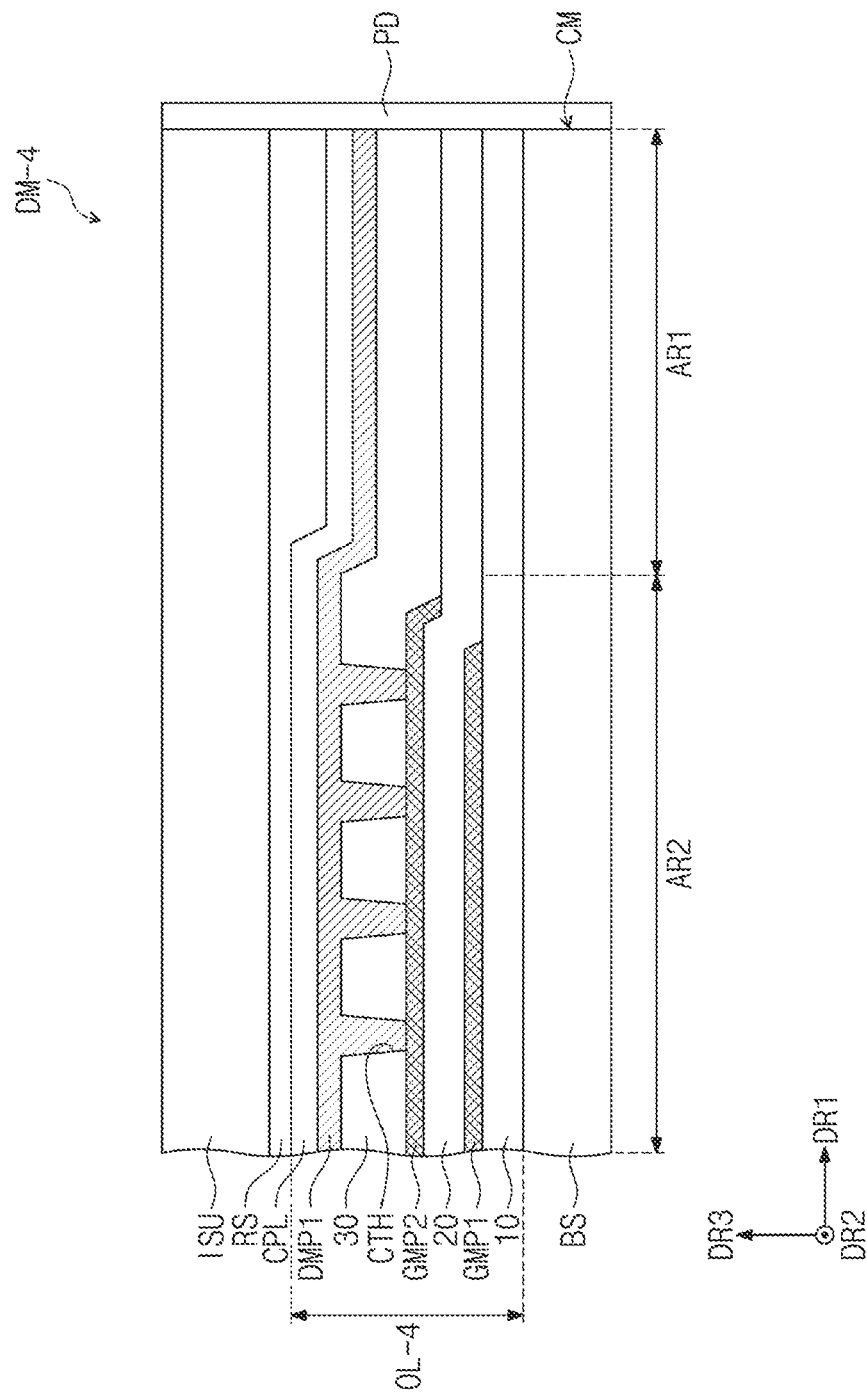

FIG. 10 is a cross-sectional view of an embodiment of a display module DM-4.

Referring to FIG. 10, the third insulating layer 30 in a peripheral line OL-4 may be disposed in an entirety of the first and second regions AR1 and AR2. Accordingly, the second conductive layer GMP2 may be capped by the third insulating layer 30.

In addition, a contact hole CTH passing through the third insulating layer 30 may be defined in the third insulating layer 30, at the second region AR2. The contact hole CTH may be formed to overlap the second conductive layer GMP2. That is, the contact hole CTH may be defined in a portion of the third insulating layer 30 which overlaps the second region AR2, and may not be defined in a portion of the third insulating layer 30, which overlaps the first region AR1.

The third conductive layer DMP1 may be electrically connected to the second conductive layer GMP2 through the contact hole CTH. The contact hole CTH may be provided in plural including a plurality of contact holes at which the third conductive layer DMP1 is electrically connected to the second conductive layer GMP2, to define a plurality of connection locations between the third conductive layer DMP1 and the second conductive layer GMP2.

Since one or more embodiment of the display module DM-4 includes the third insulating layer 30 as described above, the second conductive layer GMP2 may be entirely capped, and at the same time, the second conductive layer GMP2 and the third conductive layer DMP1 may be electrically connected to each other at a location along the third conductive layer DMP1 which is spaced apart from the side surface CM of the display device DD.

Since one or more embodiment of the display device DD includes the peripheral line OL in which the first conductive layer GMP1 and the second conductive layer GMP2 are not exposed to the outside, oxidation of the first conductive layer GMP1 and the second conductive layer GMP2 may be prevented, and the driving reliability of the display device DD may be improved.

One or more embodiment of the display device DD may minimize corrosion of conductive signal lines which provide a signal to inner components of the display device DD and, accordingly, may have improved reliability.

Although the above has been described with reference to embodiments of the invention, those skilled in the art or those of ordinary skill in the art will understand that the invention may be variously modified and changed within the scope not departing from the spirit and technical scope of the invention described in the claims to be described later.

Therefore, the technical scope of the invention should not be limited to the contents described in the detailed description of the specification, but should be determined by the claims below.

What is claimed is:

1. A display device comprising:
   a side surface which is exposed to outside the display device;
   a circuit element layer comprising:
      a gate line layer spaced apart from the side surface of the display device,
      a data line layer which is exposed to outside the display device at the side surface of the display device, and
      an insulating layer between the gate line layer and the data line layer; and
   a pad which faces the side surface of the display device and is connected to the circuit element layer at the data line layer.

2. The display device of claim 1, further comprising a resin layer which covers the data line layer and is exposed to outside the display device at the side surface of the display device,
   wherein the pad contacts the resin layer at the side surface of the display device.

3. The display device of claim 2, further comprising a display element layer which is connected to the circuit element layer and faces the data line layer of the circuit element layer,
   wherein
   the display element layer includes an end spaced apart from the side surface of the display device, and
   the resin layer is between the end of the display element layer and the pad.

4. The display device of claim 3, wherein the gate line layer which is spaced apart from the side surface of the display device corresponds to both the display element layer and the resin layer.

5. The display device of claim 2, further comprising a conductive capping layer which is between the data line layer and the resin layer and is exposed to outside the display device at the side surface of the display device.

6. The display device of claim 1, further comprising a sealing member which covers the data line layer and is exposed to outside the display device at the side surface of the display device,
wherein the pad contacts the sealing member at the side surface of the display device.

7. The display device of claim 1, wherein
the insulating layer which is between the gate line layer and the data line layer is exposed to outside the display device at the side surface of the display device, and
the pad contacts the insulating layer at the side surface of the display device.

8. The display device of claim 1, further comprising:
a base layer which faces the circuit element layer and includes a region which is adjacent to the side surface of the display device, and
the gate line layer, the insulating layer and the data line layer in order from the base layer,
wherein the data line layer contacts the region of the base layer which is adjacent to the side surface of the display device.

9. The display device of claim 1, wherein the data line layer contacts the gate line layer at a location along the data line layer which is spaced apart from the side surface of the display device.

10. The display device of claim 1, wherein the pad contacts the side surface of the display device.

11. The display device of claim 1, wherein the gate line layer comprises molybdenum.

12. A display device comprising:
a side surface which is exposed to outside the display device;
a first region and a second region in order in a direction away from the side surface of the display device;
in order:
a first insulating layer,
a first conductive layer including a first end in the second region,
a second insulating layer,
a second conductive layer including a second end in the second region, and
a third conductive layer which is exposed to outside the display device at the side surface of the display device; and
a pad which faces the side surface of the display device and is connected to the third conductive layer.

13. The display device of claim 12, further comprising a third insulating layer between the second conductive layer and the third conductive layer.

14. The display device of claim 13, wherein within the first region:
the second insulating layer contacts the first insulating layer;
the third insulating layer contacts the second insulating layer; and
the third conductive layer contacts the third insulating layer.

15. The display device of claim 14, wherein
each of the first insulating layer, the second insulating layer and the third insulating layer is exposed to outside the display device at the side surface of the display device, and
at the side surface of the display device, the pad contacts each of the first insulating layer, the second insulating layer and the third insulating layer.

16. The display device of claim 13, wherein within the second region:
the third insulating layer defines a plurality of contact holes which are spaced apart from each other; and
the third conductive layer contacts the second conductive layer at each of the plurality of contact holes.

17. The display device of claim 12, wherein within the second region, a whole surface of the third conductive layer contacts the second conductive layer.

18. The display device of claim 12, further comprising a conductive capping layer which faces the second conductive layer with the third conductive layer therebetween.

19. A display device comprising:
a display panel comprising:
a side surface which is exposed to outside the display panel,
a display element layer spaced apart from the side surface of the display panel, and
a circuit element layer connected to the display element layer, the circuit element layer comprising a peripheral line through which a signal is provided from outside the display panel to the display element layer, the peripheral line comprising:
a first conductive layer, a second conductive layer and a third conductive layer in order toward the display element layer, and an insulating layer which is between two layers among the first to third conductive layers,
each of the first conductive layer, the second conductive layer and the third conductive layer having a length extended from the display element layer and toward the side surface of the display panel, and
the length of the third conductive layer greater than the length of each of the first conductive layer and the second conductive layer; and
a pad which faces the side surface of the display device and is connected to the circuit element layer at the third conductive layer.

20. The display device of claim 19, wherein
the third conductive layer is exposed to outside the display device at the side surface of the display device,
the pad contacts the third conductive layer at the side surface of the display panel,
the first conductive layer and the second conductive layer are spaced apart from the side surface of the display panel, and
the insulating layer or the third conductive layer extends further from the display element layer and toward the side surface of the display panel than each of the first conductive layer and the second conductive layer.

\* \* \* \* \*